US007550974B2

(12) United States Patent
Schneider et al.

(10) Patent No.: US 7,550,974 B2

(45) Date of Patent: Jun. 23, 2009

(54) IGNITION COIL TESTER APPARATUS AND METHOD

(76) Inventors: Robert Schneider, 39376 Harpers Corner Rd., Mechanicsville, MD (US) 20659; Greg Reynolds, 19825 Fall Ct., Great Mills, MD (US) 20634

( * ) Notice: Subject to any disclaimer, the term of this patent is extended or adjusted under 35 U.S.C. 154(b) by 60 days.

(21) Appl. No.: 11/735,824

(22) Filed: Apr. 16, 2007

(65) Prior Publication Data

US 2007/0273382 A1 Nov. 29, 2007

Related U.S. Application Data

(60) Provisional application No. 60/793,039, filed on Apr. 19, 2006.

(51) Int. Cl.
*F02P 17/00* (2006.01)
*G01R 31/06* (2006.01)

(52) U.S. Cl. ....................................... 324/388; 324/546

(58) Field of Classification Search ................. 324/388, 324/546

See application file for complete search history.

(56) References Cited

U.S. PATENT DOCUMENTS 4,186,337 A * 1/1980 Volk et al. .................. 324/388
4,631,451 A * 12/1986 Anderson et al. ....... 315/209 R
5,196,798 A * 3/1993 Baeza et al. ................ 324/388

* cited by examiner

*Primary Examiner*—Timothy J Dole
(74) *Attorney, Agent, or Firm*—The Marbury Law Group, PLLC

(57) ABSTRACT

A simple "go or no go" ignition coil tester identifies coils that have failed or that are about to fail by driving a coil with sufficient voltage and amperage to operate at its peak output. Coils that have failed or that are close to failure cannot operate at peak output and thus fail the test. A standard kilovolt tester is used to simulate a spark plug and an audio indication of sparking produced by the kilovolt tester is used to confirm operation or failure of the coil. The system dispenses with short circuit and closed circuit test apparatus as well as the structures and failings associated with visual spark indicators.

18 Claims, 6 Drawing Sheets

IGNITION COIL TESTER APPARATUS AND METHOD

RELATED APPLICATIONS

This application claims the benefit of U.S. Provisional Application Ser. No. 60/793,039, filed Apr. 19, 2006, which is hereby incorporated by reference for all purposes.

BACKGROUND OF THE INVENTION

The present invention is drawn to an automotive ignition coil tester for the identification of coils that have failed and coils which are about to fail.

Spark ignition systems are used extensively in most small and intermediate size engines, such as those used in automotive applications. A spark ignition system is used to provide a spark in the cylinders of both two and four cycle engines to ignite the compressed air-fuel mixture to drive the pistons (or, in the case of a rotary engine, the rotors). The ignition system uses a battery and a generator to supply electrical power to the system, and a distributor having points or a breakerless impulse generation system, which together are used to supply ignition pulses to spark plugs located in each of the cylinders. The heart of the ignition system is the ignition coil, which is located between the power supply and the distributor. The ignition coil converts the low voltage of the power supply (the battery) to the high voltage pulses required by the spark plugs.

If an ignition coil fails, the engine will be inoperative. As such, it is desirable to have some mechanism for testing an ignition coil to determine whether or not it is good or defective. While an ohmmeter may be used with limited success to check a coil to see whether it is defective, an ohmmeter does not test a coil under actual operating conditions. In use, an ohmmeter is used to check if the resistance falls within a given range. If it does it is assumed that the coil is not defective.

However, it is possible for coils to "ohm out" with an acceptable resistance and still be defective, that is, it may fail in the immediate future or under operating conditions. This creates an exasperating situation in which an automotive mechanic falsely believes that the problem cannot be due to a defective oil, because it ohms out properly, and therefore spends a great deal of time investigating and possibly even replacing other properly functioning component parts until all else has been exhausted. Finally in desperation, the mechanic may decide to replace the coil which then solves the problem. As a result of a faulty test of the coil, a great deal of time is spent troubleshooting and attempting repair in vain. Additionally, if such a faulty coil is not detected, the consumer drives the vehicle away only to have the coil fail later.

Because a bad coil is often a cause of ignition problems even when it "ohms out" properly, many mechanics replace older coils as a matter of course when dealing with ignition problems. As such, many properly-functioning coils are unnecessarily replaced at significant expense to vehicle owners.

In addition to the ohmmeter test, many ignition coil testers have been developed that attempt to test the coil under operating conditions to see if it properly produces a spark or a facsimile thereof. While these systems can be useful for identifying bad coils, they do not always identify coils that are malfunctioning intermittently and cannot identify coils that are about to fail. Clearly, it is desirable to be able to easily and quickly ascertain with accuracy whether a coil is functioning properly, about to fail, or has already failed.

As might be expected, the prior art contains a number of references which, to some extent, have attempt to address at least part of this problem. U.S. Pat. No. 2,249,157, to Morgan et al., U.S. Pat. No. 3,354,387, to Whaley et al., and U.S. Pat. No. 4,186,337, to Volk et al. are three such references. The Morgan et al. patent uses a large device with electrical circuitry to supply pulses to a coil and to analyze the output. In operation, the Morgan et al. device uses a complex and bulky electrical apparatus to merely determine visually whether the secondary coil has produced an output. It will not necessarily identify intermittent failures since visual indications of intermittent failure can be difficult to ascertain. Furthermore, Morgan et al. cannot determine if a coil is likely to fail in the near future.

The Whaley et al. patent is an improvement over Morgan et al. in that it is smaller, but still uses a visual indication of the spark. Again, however, it will not necessarily identify intermittent failures and cannot determine if a coil is about to fail.

The Volk et al. patent is concerned with testing the entire ignition system and thus has many other parts and functions. For isolated testing of the coil, it sends a substitute pulse (e.g., that a good ECU would supply) to the coil and checks for function with a spark indicator device. The spark indicator device provides both audio and visual feedback, but it cannot identify when a coil is about to fail.

U.S. Pat. No. 4,331,921 to Walker discloses a circuit for detecting an interruption of primary current caused by other ignition system problems. U.S. Pat. No. 4,401,948, to Miura et al. discloses a system measuring the rise of secondary coil output voltage to determine stray capacitance in the ignition system. U.S. Pat. No. 4,449,100 to Johnson et al. discloses a device which evaluates the integral of secondary voltage over time. These devices are complex, for the most part expensive, and are not designed to determine whether a coil is functioning properly or not, or whether it is about to fail.

U.S. Pat. No. 5,196,798, to Baeza et al. is designed to test coil function. However, it appears that Baeza et al. only supplies a maximum of 12 volts to the coil being tested. Since coils generally need an extra "kick" to get started, Baeza et al. does not fire the coil being tested under operating conditions. As with many of the other testers, the device of Baeza et al. uses a visual indicator to indicate function, an electrode spark gap viewable through a window, and is thus subject to the difficulties of identifying intermittent problems. The coil tester of Baeza et al., despite being described as inexpensive, also requires additional elements such as a resistor for use with coils requiring an external resistor for proper operation, a short circuit detection circuit, a short circuit indicator lamp, a vacuum, and a spark gap viewer.

U.S. Pat. No. 6,836,120 to Lite discloses another ignition coil tester. This unit relies upon a visual confirmation of a spark, but only tests with a single pulse. One pulse is not accurate enough to be efficient, or to find potential intermittent problems. Lite attempts to identify weak or failing coils by use of a variable spark gap. However, this can be more a measure of the power supply (i.e., vehicle battery) than the function of the coil. As admitted by Lite, spark generation is also affected by the atmosphere within the spark chamber, which is difficult to keep consistent due to the need for a variable length electrode within the chamber.

U.S. Pat. No. 5,479,101 to Change discloses another ignition coil tester. This unit needs an external power supply (i.e., 110V AC from a wall) and further includes short circuit and open circuit detectors and indicators. A series of neon lamps is used to indicate the strength of the coil output.

Published App. No. US 2005/0200361 to Bumen discloses an ignition coil tester that uses a fake cylinder chamber to view the spark. It uses the vehicle's ignition system and tests the coil as if it were in its installed state. The coil goes into the chamber and is fired using a fake spark plug. The Bumen device is expensive and, since coils vary in size and shape, a new test chamber would have to be built for any additional coils.

GB Pat. No. 1190438 to Ledger et al. discloses a tester comprising an electric motor, a set of points, and a condenser for the testing of conventional coils using an adjustable, calibrated spark gap. It apparently relies upon visual inspection of the spark, and thus suffers the problems mentioned above.

U.S. Pat. No. 2,501,802 to Walker discloses an ignition coil tester that uses a mechanical relay. It also relies upon visual inspection of the spark, and thus suffers the problems mentioned above.

While hobbyists have designed various circuits that use timing chips and automotive ignition coils to provide high voltage sparks or pulses, such as for flashing xeon tubes or making a "Jacob's Ladder" device, they do not disclose circuits or devices for testing ignition coils and identifying those that are failing or about to fail.

It is accordingly an aspect of the present invention to provide a small, inexpensive ignition coil tester which is capable of accurately testing an ignition coil to determine whether or not it has failed or is about to fail. The testing device should be simple, easy to use, and provide direct connections to an automotive type coil so that it may be tested.

It is an aspect of the invention to provide an ignition coil testing device operable using electrical power from an automotive battery rather than requiring internal batteries in the device or other outside power sources, thus minimizing the size and weight of the testing device.

It is another aspect of the present invention to dispense with reliance on visual spark indicators by providing audio feedback of the coil being tested.

It is yet another aspect of the present invention to provide a test method for ignition coils that relies upon listening to coil operation to more reliably identify intermittent misses.

It is a further aspect of the to provide brief operation of a coil at its peak output to identify coils that are near failure.

It is another aspect of the invention to provide an ignition coil tester with a direct connection to coils so as to eliminate polarity errors during testing.

It is yet another aspect of the invention to provide an ignition coil tester using inexpensive and easily available parts.

BRIEF SUMMARY OF THE INVENTION

The present invention provides a simple "go or no go" ignition coil tester that identifies coils that have failed or that are about to fail. It dispenses with the need for short circuit and open circuit detection and indication means. It further dispenses with the need for any external resistors for testing coils that require them since the present inventors have found that coils can be tested in accordance with the present invention at higher voltages for shorter periods of time without damage to these coils.

In use, the ignition coil tester of the present invention briefly "over drives" the coil being tested and provides sufficient volts and amps to operate the coil at its peak output. Most coils that are nearing breakdown cannot perform at peak output. Therefore, providing for such testing gives an indication of a potential failure when tested in this manner. The coil is supplied with its normal operating voltage (typically 12V) and driven at approximately 34 Hz so as to attempt to cause a spark in a kilovolt tester requiring a 45 kV. Indeed, some weaker coils will misfire internally, which means that in their cycle somewhere, it does not spark, but it only misses one or two sparks, then goes back to normal. Because of these types of intermittent failures, a single spark test is not efficient.

In an exemplary embodiment of the present invention, an off-the-shelf kilovolt tester is used to simulate the function of a spark plug. Instead of relying solely upon a visual indication of a spark, which can be difficult depending on the lighting conditions and which can make identification of intermittent failure nearly impossible due to the formation of afterimages on the retinas of a user, the present invention further provides an audio indication of the coil operation by producing an audio output of the sparks produced in the kilovolt tester via the sound of the sparking in the kilovolt tester. In use, an intermittent miss is vastly easier to hear than it is to see, thus making the "listening" method of the present invention more accurate than prior art methods that rely upon visual observance of a spark.

In one embodiment, a known "good" coil can be switchably mounted in parallel with the coil being tested so that, by switching between the two coils, the sound produced in the kilovolt tester by the coil under test can be compared with the sound of a known good coil. When the audible frequency of the sparking in the kilovolt tester for a coil under test is noticeably lower, the user will have an indication of intermittent coil failure.

The present invention further addresses problems due to differentiating between the positive and negative terminals of a coil and the possibility of a false reading when the connections are reversed. By supplying one or more universal coil connectors with the most commonly used direct fit connectors and universal blade ins, the present invention assures that the polarity of the coil terminals is correct. In yet another embodiment for less common coils, standard alligator clips can be provided.

One embodiment of the present invention is an ignition coil test apparatus comprising a pair of terminals for connecting to a positive terminal of an automotive battery and for connecting to ground to supply power to the test apparatus, circuitry for providing a substantially square wave coil-driving signal at a test frequency, an amplifier connected to the circuitry for increasing a voltage of a coil-driving signal to a design voltage of the "ground pulses" of the coil under test, a wiring harness connected to the amplifier and adapted for attaching the amplified coil-driving signal to a negative terminal of the coil under test and a appropriate positive voltage to a positive terminal of the coil under test, and a kilovolt tester attached to an output terminal of the coil under tests, wherein sparking in the kilovolt tester produces sound representative of coil operation.

Variations on this embodiment include those wherein the circuitry for providing a coil-driving signal further comprises a flip-flop chip and appropriate resistors, those further comprising a light emitting diode to indicate when sufficient power is being supplied to the device, those wherein the wiring harness further comprises a direct fit connector for the coil under test, those wherein the appropriate positive voltage is a +12V from a fused source, those further comprising a known good coil switchably mounted in parallel with the coil under test for sound comparison purposes, and those wherein the test frequency is approximately 34 Hz.

In another embodiment, the present invention is drawn to an ignition coil test method comprising obtaining power from an automotive battery source, forming a substantially sinusoidal coil-driving signal at a test frequency, amplifying the coil-driving signal, supplying the coil-driving signal to a negative terminal of a coil under test and appropriate positive voltage to a positive terminal of the coil under test, passing output from the coil under test to a kilovolt tester to produce sparking in the presence of an adequate output, wherein sparking in the kilovolt tester produces sound representative of coil operation, and listening to the sound to determine operative status of the coil under test.

Variations of this method include those wherein the coil-driving signal is supplied using a flip-flop chip and appropriate resistors, those further comprising checking for reception of sufficient power from the automotive battery using a light emitting diode, those further comprising using a direct fit connector to supply the coil-driving signal to a negative terminal of a coil under test and appropriate positive voltage to a positive terminal of the coil under test, those wherein supplying appropriate positive voltage is supplying +12V from a fused source, those further comprising providing a known good coil switchably mounted in parallel with the coil under test and comparing sound produced by each coil, and those wherein the test frequency is approximately 34 Hz.

DETAILED DESCRIPTION OF THE INVENTION

One embodiment of the present invention is a simple "go or no go" ignition coil tester that identifies coils that have failed or that are about to fail by driving the coil with sufficient voltage and amperage to operate at its peak output. Coils that have failed or that are close to failure cannot operate at peak output and thus fail the test. A standard kilovolt tester is used to simulate a spark plug and an audio indication of sparking is used to confirm operation or failure of the coil. The system draws power from an automotive battery associated with the engine and includes a LED to confirm the power connection.

Figure 1:
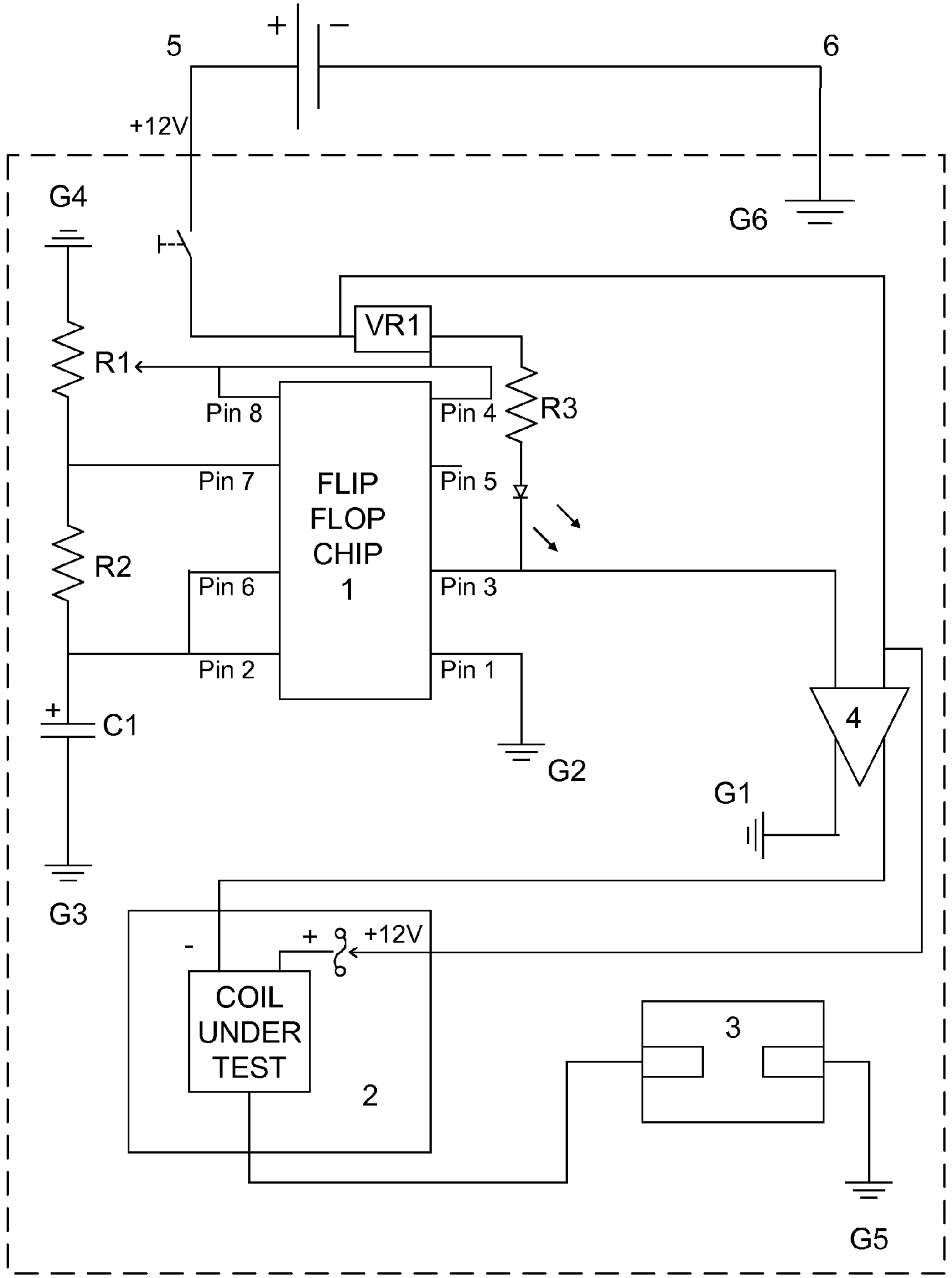
FIG. 1 illustrates a schematic of a coil tester in accordance with an embodiment of the present invention.

A schematic of a coil tester in accordance with an embodiment of the present invention is illustrated in FIG. 1. While not meant as a limitation, it is desirable to build the ignition coil tester from easily available parts and in a modular fashion so as to allow for easier servicing and repair of the unit. Similarly, for cost savings, it can be desirable to build an integrated, non-serviceable unit for specific markets. The simplicity of the invention makes either embodiment possible.

Power for the ignition coil tester is supplied by attaching terminals 5 and 6 to the positive and negative terminals of the automotive battery (not shown), which in this example is a 12V battery. Attachment can be done by jumper cables or dedicated attached to terminals 5 and 6. As such, terminal 5 will be a +12V and terminal 6 is attached to ground at G6. An LED 7 is mounted downstream of the on/off switch along with resistor R3 so as to indicate that the unit is receiving the proper power.

In an embodiment using available parts, a Flip Flop chip 1 is used to provide the driving signal for the coil. Such a chip is available from Radio Shack as model LM555 precision timer, Catalog #276-1723. The Flip Flop chip 1 and signal amplifier 4 act to ground the coil under test with ground pulses at frequency that is believed to sufficiently stress the coil. The present inventors have found 33.6 Hz to be sufficient, but other frequencies may be possible and the invention is not meant to be limited by this finding. Pin 3 on Flip Flop chip 1 provides a substantially square wave signal with an amplitude between ±5-7V at a frequency of 33.6 Hz. Although a square wave signal is disclosed, any substantially pulsed signal that can provide an adequate signal to ultimately provide the ground pulses for the coil under test may be used, including any appropriate sawtooth and sine wave signals.

The Flip Flop chip 1, in the embodiment using the Radio Shack LM555, is a precision monolithic timing circuit capable of producing accurate time delays or oscillation. In the oscillator or astable mode of operation, the frequency and duty cycle may be independently controlled with two external resistors and a single external capacitor. The threshold and trigger levels are normally two-thirds and one-third, respectively, of VCC. These levels can be altered by use of the control voltage terminal. When the voltage input falls below the trigger level, the flip-flop is set and the output goes high. If the trigger input is above the trigger level and the threshold input is above the threshold level, the flip-flop is reset and the output is low. RESET can override all other inputs and can be used to initiate a new timing cycle. When RESET goes low, the flip-flop is reset and the output goes low. Whenever the output is low, a low-impedance path is provided between DISCH and ground.

In a preferred embodiment of the present invention, a voltage regulator VR1 (model: 7805 available from Radio Shack as Catalog #: 276-1770) is used to regulate the voltage from the vehicle battery to the proper +5V used by Flip Flop chip 1, grounds G1-G5 all go to G6, R1 is a 100KΩ potentiometer/trimmer (marked "104"), R2 is a 10KΩ resistor, R3 is a 470Ω resistor, C1 is a 1 μF capacitor, and the square waves output from pin 3 are at a frequency of 33.6 Hz.

Figure 3:
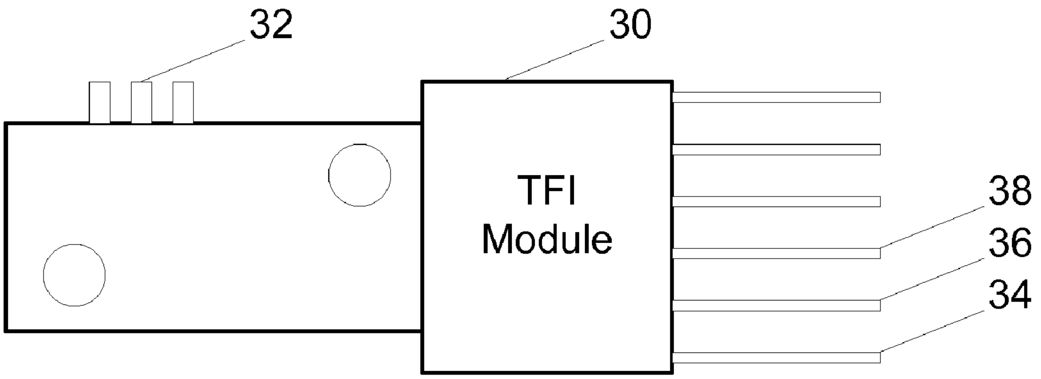
FIG. 3 illustrates the wiring of a TFI module that can be used as part of the present invention.

The square wave "signal IN" from Pin 3 of the Flip Flop chip 1 is sent to a signal amplifier 4. Signal amplifier 4 receives a +12V input from the automotive battery (not shown) attached to terminals 5 and is attached to ground at G1. A "signal OUT" from signal amplifier 4 provides grounded pulses to operate the coil and is sent to the negative terminal of the coil under test, which is attached to the wiring harness 2. In a preferred embodiment, the signal amplifier 4 is a Thick Film Ignition (TFI) module such as those which were used on Ford vehicles with distributors from the early 1980s to the mid-1990s. TFI modules are available as Holley 891-105 or Accel 35368, as well as from a number of aftermarket sources. As shown in FIG. 3, the signal IN from pin 3 is sent to the middle input terminal 32 of the TFI module 30. The black wire 34 is connected to ground, the blue wire 36 is connected to the negative terminal on the coil and the red wire 38 is connected to +12V.

A fused supply of +12 V from the vehicle battery terminal is attached to the positive terminal of the coil under test. The output of the coil is then sent to a kilovolt tester 3. The kilovolt tester 3 simulates a spark plug. Such kilovolt testers are also known as high energy ignition (HEI) spark testers and can be purchased off-the-shelf as K-D tools 2756 (also available from Snap-On), A-C Delco ST-125, Mac ET 760H, or equivalent at any well stocked auto parts store. Such kilovolt testers require 45 kV in order to produce a spark and include a means for viewing sparking within the kilovolt tester. However, the present invention does not need to rely upon visual indication of sparks due to the sound produced by the kilovolt tester. In use, the kilovolt tester is preferably mounted in a position that does not impede the sound produced by sparking.

The other terminal of the kilovolt tester 3 is attached to ground at G5. When a coil under test is driven at its peak, sparking at the kilovolt tester 3 indicates proper functioning of the coil. The sparking of the kilovolt tester 3 produces an audible buzzing sound that will change frequency depending on the operational status of the coil under test. If the coil under test has completely failed, there will be no sparking and no audible sound. If the coil under test is about to fail or failing intermittently, the buzzing sound will have a noticeable dip in frequency (i.e., a lower-sounding buzzing).

A device in accordance with the present invention uses a listening method to determine proper operation of a coil under test. This is more accurate than devices that rely solely upon visual confirmation of a spark because a coil can spark and still not function properly. Coils spark so fast that it is nearly impossible to see a single intermittent miss in the spark. Misses are a common problem in coils, and if a user cannot see it with a visual inspection method, the improper functioning of the coil will be missed. However, a miss at the operational frequency of the present invention of 33.6 Hz is quite obvious to the ear when using the present listening method.

The wiring harness 2 of FIG. 1 optionally includes, without limitation, one or more universal coil connectors. For example, for ignition coils used by Ford vehicles, a pigtail assembly with a connector for Ford ignition coils for 1999-2004 vehicles is available from CarQuest, catalog no. 5-819. When using the most common direct fit connectors and universal blade ins, the present invention assures that the polarity of the coil terminals is correct. In this manner, the present invention addresses problems due to differentiating between the positive and negative terminals of a coil and the possibility of a false reading when the connections are reversed. In a preferred embodiment, the tester incorporates a direct fit connector and universal blade in (male or female). Various direct fit connectors for different makes of vehicles are provided that plug into the tester using a matching blade in connector (female or male). Of course, for less common coils, standard alligator clips can be provided. Likewise, in other embodiments, the wiring harness 2 can have a direct fit connector hardwired into the tester for use with a single make of vehicle.

Figure 2:
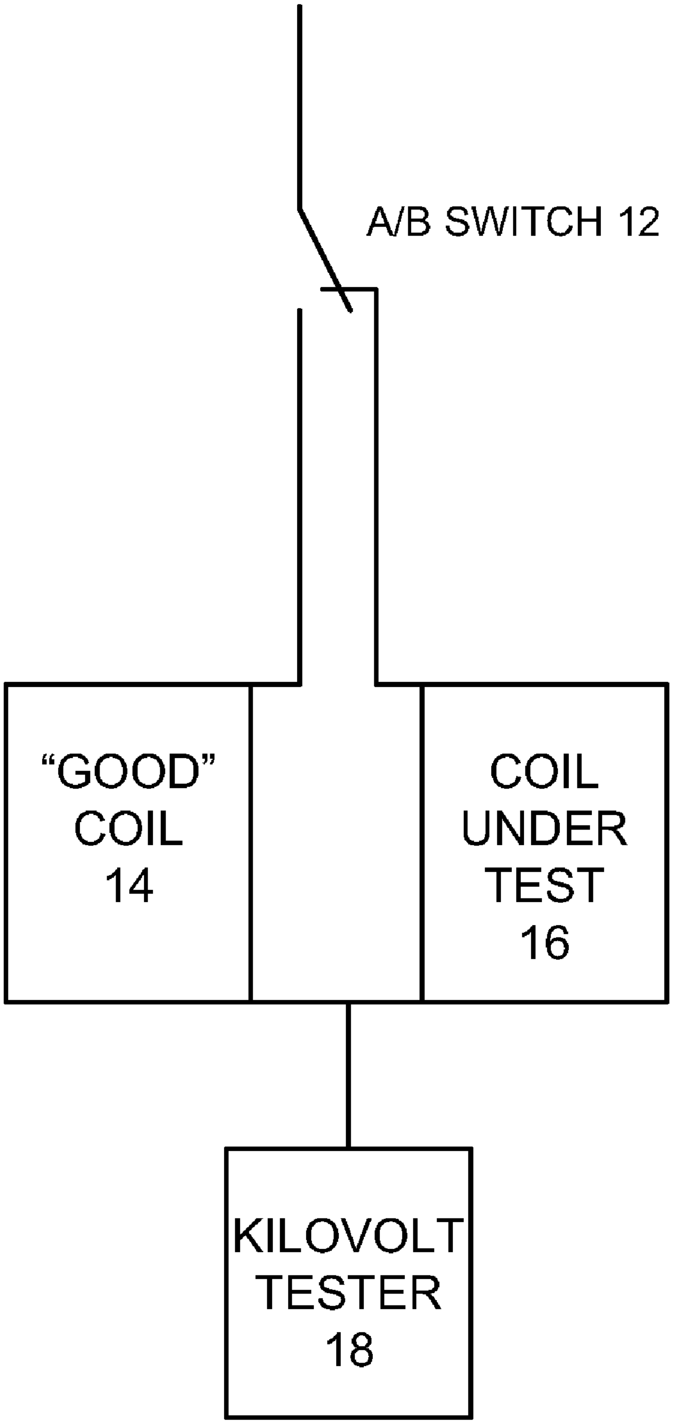
FIG. 2 illustrates the switchable portion of an alternate embodiment of the invention that employs a known good coil for audio comparison.

FIG. 2 illustrates an embodiment of the invention that uses a known good coil 14 for audible comparison with the coil under test 16. Coils 14 and 16 are mounted in parallel between an A/B switch 12 connected to the signal amplifier (not shown) and the kilovolt tester 18. By alternately connecting the two coils with switch 12, direct comparison of the sound produced by the kilovolt tester 18 can be made between a good coil 14 and the coil under test 16.

Figure 4A:
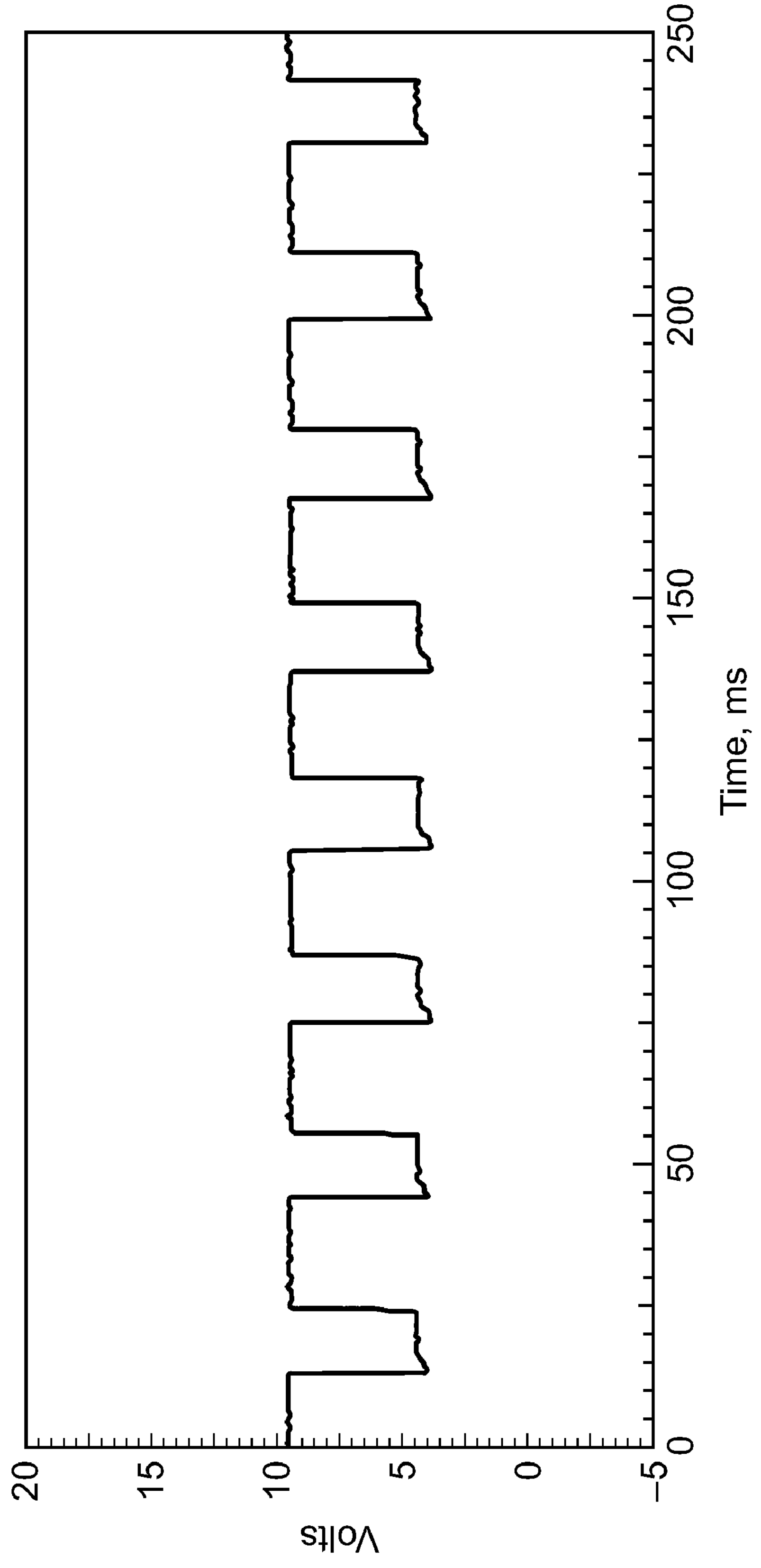
FIGS. 4A-C illustrate example traces of the voltage going into the TFI module, the voltage at the coil, and the output by the coil, respectively, in accordance with a coil test of the present invention.
Figure 4B:
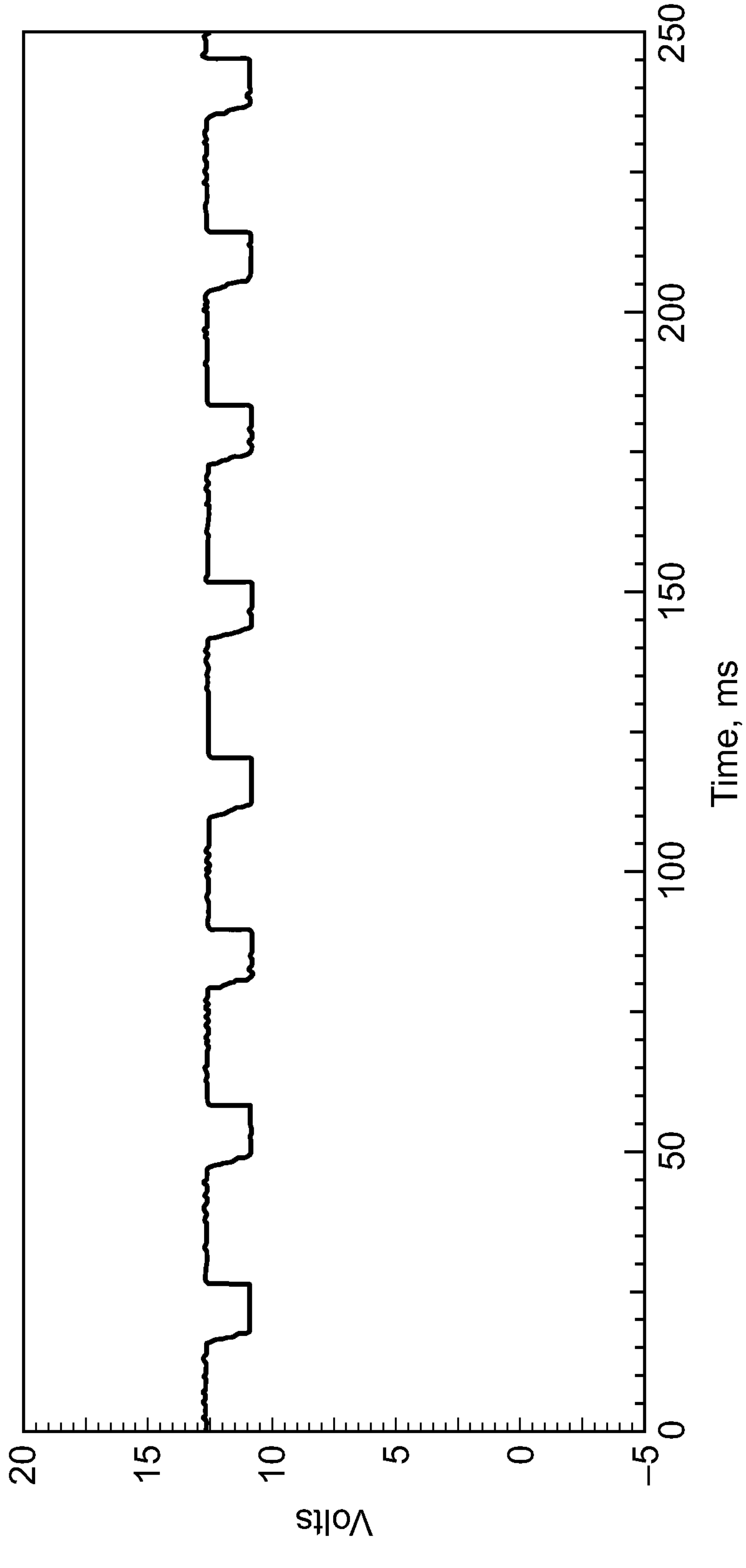
Figure 4C:
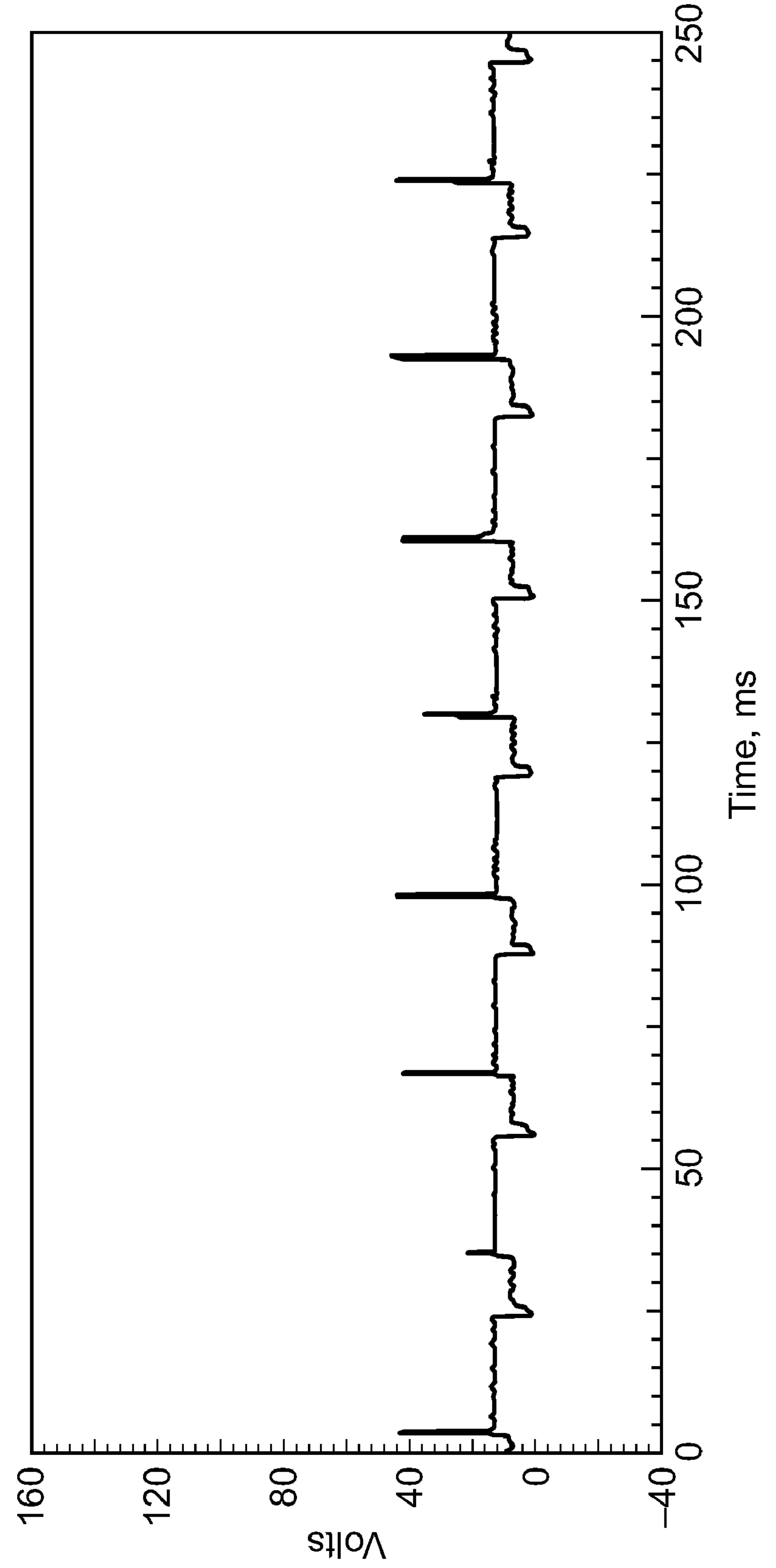

FIG. 4A illustrates an example trace of the voltage going into the TFI module from pin 3 of the Flip Flop chip 1, which in this case is a square wave between ~5V and ~10V. FIG. 4B illustrates an example trace of the voltage at the coil, varying between ~12V and ~10V. FIG. 4C illustrates an example trace of the voltage output by the coil, in this case a good coil providing adequate voltage to produce sparks.

Other variations of the present invention can include using a speaker or amplified speaker to audibly indicate the RF signals produced by the sparking within the kilovolt tester or other simulated spark plug, as well as using an audio output of the coil input signal from a speaker as the audio comparison source instead of a "good" coil being tested.

A system and method for providing ignition coil testing have been described. It will be understood by those skilled in the art that the present invention may be embodied in other specific forms without departing from the scope of the invention disclosed and that the examples and embodiments described herein are in all respects illustrative and not restrictive. Those skilled in the art of the present invention will recognize that other embodiments using the concepts described herein are also possible. Further, any reference to claim elements in the singular, for example, using the articles "a," "an," or "the" is not to be construed as limiting the element to the singular.

What is claimed is:

1. An ignition coil test apparatus, comprising:

a pair of terminals for connecting to a positive terminal of an automotive battery and for connecting to ground to supply power to the test apparatus;

circuitry for providing a substantially square wave coil-driving signal at a test frequency of approximately 34 Hz;

an amplifier connected to the circuitry for providing ground pulses to a negative terminal of the coil under test;

a wiring harness connected to the amplifier and adapted for attaching the coil-driving ground pulse signal to a negative terminal of the coil under test and a appropriate positive voltage to a positive terminal of the coil under test so as to over drive the coil at its peak output with a substantially square wave signal varying between approximately 10 volts and approximately 12 volts; and a kilovolt tester requiring 45 kV to produce a spark attached to an output terminal of the coil under test, wherein sparking in the kilovolt tester produces sound representative of coil operation.

2. The ignition coil test apparatus of claim 1, wherein the circuitry for providing a coil-driving signal further comprises a flip-flop chip and appropriate resistors.

3. The ignition coil test apparatus of claim 1, further comprising a light emitting diode to indicate when sufficient power is being supplied to the device.

4. The ignition coil test apparatus of claim 1, wherein the wiring harness further comprises a direct fit connector for the coil under test.

5. The ignition coil test apparatus of claim 4, wherein the direct fit connector for the coil under test is connected using a universal blade in connection.

6. The ignition coil test apparatus of claim 1, wherein the appropriate positive voltage is a +12V from a fused source.

7. The ignition coil test apparatus of claim 1, further comprising a known good coil switchably mounted in parallel with the coil under test for sound comparison purposes.

8. The ignition coil test apparatus of claim 1, wherein the amplifier is a Thick Film Ignition (TFI) module.

9. The ignition coil test apparatus of claim 1, wherein the kilovolt tester is a High Energy Ignition (HEI) spark tester.

10. An ignition coil test method, comprising:

obtaining power from an automotive battery source;

forming a substantially square wave coil-driving signal at a test frequency of approximately 34 Hz;

amplifying the coil-driving signal to form ground pulses;

supplying the coil-driving signal to a negative terminal of a coil under test and appropriate positive voltage to a positive terminal of the coil under test to over drive the coil at its peak output with a substantially square wave signal varying between approximately 10 volts and approximately 12 volts;

passing output from the coil under test to a kilovolt tester requiring 45 kV to produce a spark so as to produce sparking in the presence of an adequate output, wherein sparking in the kilovolt tester produces sound representative of coil operation; and listening to the sound to determine operative status of the coil under test.

11. The ignition coil test method of claim 10, wherein the coil-driving signal is supplied using a flip-flop chip and appropriate resistors.

12. The ignition coil test method of claim 10, further comprising checking for reception of sufficient power from the automotive battery using a light emitting diode.

13. The ignition coil test method of claim 10, further comprising using a direct fit connector to supply the coil-driving signal to a negative terminal of a coil under test and appropriate positive voltage to a positive terminal of the coil under test.

14. The ignition coil test method of claim 13, further comprising attaching the direct fit connector using a universal blade in connection.

15. The ignition coil test method of claim 10, wherein supplying appropriate positive voltage is supplying +12V from a fused source.

16. The ignition coil test method of claim 10, further comprising providing a known good coil switchably mounted in parallel with the coil under test and comparing sound produced by each coil.

17. The ignition coil test method of claim 10, wherein amplifying is provided by a Thick Film Ignition (TFI) module.

18. The ignition coil test method of claim 10, wherein the kilovolt tester is a High Energy Ignition (HEI) spark tester.

* * * * *